United States Patent
Ryu

(10) Patent No.: US 11,488,828 B2
(45) Date of Patent: *Nov. 1, 2022

(54) METHOD OF INDIRECT HEATING USING LASER

(71) Applicant: RNR LAB INC., Seoul (KR)

(72) Inventor: Jeong Do Ryu, Seoul (KR)

(73) Assignee: RNR LAB INC., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/198,862

(22) Filed: Mar. 11, 2021

(65) Prior Publication Data

US 2021/0217621 A1    Jul. 15, 2021

Related U.S. Application Data

(62) Division of application No. 16/498,390, filed as application No. PCT/KR2018/001170 on Jan. 26, 2018, now Pat. No. 10,978,304.

(30) Foreign Application Priority Data

Mar. 31, 2017    (KR) ........................ 10-2017-0041927

(51) Int. Cl.
| | |
|---|---|
| *H01L 21/268* | (2006.01) |
| *H01L 21/324* | (2006.01) |
| *H01L 21/762* | (2006.01) |
| *H01L 27/108* | (2006.01) |
| *H01L 27/11524* | (2017.01) |

(52) U.S. Cl.
CPC .......... *H01L 21/268* (2013.01); *H01L 21/324* (2013.01); *H01L 21/76224* (2013.01); *H01L 27/1085* (2013.01); *H01L 27/11524* (2013.01)

(58) Field of Classification Search
None
See application file for complete search history.

(56) References Cited

U.S. PATENT DOCUMENTS

| | | | | |
|---|---|---|---|---|
| 2005/0272233 | A1* | 12/2005 | Lee | H01L 29/66621 |
| | | | | 257/E21.429 |
| 2010/0025757 | A1* | 2/2010 | Son | H01L 29/7827 |
| | | | | 257/329 |
| 2010/0240180 | A1* | 9/2010 | Jeon | H01L 29/78 |
| | | | | 438/270 |

FOREIGN PATENT DOCUMENTS

| | | | |
|---|---|---|---|
| KR | 10-2008-0114403 | * | 12/2008 |
| KR | 10-2010-0001747 | * | 1/2010 |
| KR | 10-2012-0000150 | * | 1/2012 |
| KR | 10-2012-0003422 | * | 1/2012 |
| KR | 10-2013-0026671 | * | 3/2013 |
| KR | 10-2015-0105195 | * | 9/2015 |

* cited by examiner

*Primary Examiner* — Bo B Jang
(74) *Attorney, Agent, or Firm* — STIP Law Group, LLC

(57) ABSTRACT

An indirect heating method using a laser according to an aspect of the present disclosure includes: a first process of adjacently placing a first material structure containing metal and a second material structure containing inorganic material; and a second process of directly heating the first material structure to indirectly heat the second material structure adjacent to the first material structure by radiating a laser to the first material structure.

10 Claims, 8 Drawing Sheets

METHOD OF INDIRECT HEATING USING LASER

CROSS-REFERENCES TO RELATED APPLICATION

The present application is a divisional application Ser. No. 16/498,390 filed on Sep. 27, 2019, which in turn claims the benefit of PCT/KR2018/001170 filed on Jan. 26, 2018 and Korean Patent Application No. 10-2017-0041927 filed on Mar. 31, 2017, the disclosures of which are incorporated by reference into the present application.

BACKGROUND OF THE INVENTION

1. Field

The present disclosure relates to a heating method using a laser and more particularly, to an indirect heating method using a laser.

2. Description of the Related Art

Examples of heating methods include radiating a laser to a target object. A laser refers to condensed light obtained by concentrating energy spread in the space on one point. It is possible to concentrate tremendous energy by overlapping waves sharing the same point in the space. To operate a laser, a special medium, such as a special gas, crystal, or diode, that transmits a laser is needed. If energy in the form of electricity, radio wave, or light is injected into such a medium, electrons in the medium absorb the energy and then jump into the outer electron shells and thus atoms are in an excited state. If light is injected thereto, the excited atoms collide with photons to release numerous photons and return to a stable state, i.e., low-energy state. In this case, the released photons collide again with other atoms to release numerous photons. While this process is rapidly repeated, the photons are suddenly released into light.

One of the prior art technologies is disclosed in Korean Laid-open Publication No. 20150105195 (published on Sep. 16, 2015 and entitled "Laser heating treatment method and method for manufacturing solid state imaging device").

SUMMARY OF THE INVENTION

The present disclosure is conceived to provide a method of indirect heating of inorganic material-containing material using a laser. However, this problem is provided for illustrative purposes only but not intended to limit the scope of the present disclosure.

An aspect of the present disclosure provides an indirect heating method using a laser. The indirect heating method using a laser includes: a first process of adjacently placing a first material structure containing metal and a second material structure containing inorganic material; and a second process of directly heating the first material structure to indirectly heat the second material structure adjacent to the first material structure by radiating a YAG laser, a diode laser, or a $CO_2$ laser to the first material structure. The $CO_2$ laser is implemented using $CO_2$ as a source and may be a long-wavelength laser having a mean wavelength of 10 μm to 11 μm. The YAG laser is implemented using neodymium-doped yttrium aluminum garnet (Nd:YAG) as a source and may have a wavelength of 532 nm, 940 nm, 1064 nm, 1120 nm, 1320 nm, or 1440 nm and may be doped with erbium (Er), ytterbium (Yb), or the like instead of neodymium (Nd).

In the indirect heating method using a laser, the first material structure and the second material structure may be placed in contact with each other.

In the indirect heating method using a laser, heat generated by radiating the laser to the first material structure may be more than heat generated by radiating the laser to the second material structure.

In the indirect heating method using a laser, the first process may include: forming an insulating film within a trench implemented in a device structure and forming, as the second material structure, a channel film of a second material on the insulating film within the trench; and after forming the channel film, forming, as the first material structure, a core portion of a first material filing an empty space within the trench and a laser receiving pad of the first material on a top surface of the device structure to be connected to the core portion, and the second process may include heating or melting the second material by radiating the laser onto the laser receiving pad to reduce a resistance of the channel film. In this case, the device structure may include a vertical NAND (VNAND) structure, and the second material may include polysilicon.

In the indirect heating method using a laser, the first process may include: forming a bottom electrode within a trench implemented in a device structure; forming, as the second material structure, a dielectric film of a second material on the bottom electrode within the trench; and forming, as the first material structure, a top electrode of a first material on the dielectric film within the trench and a laser receiving pad of the first material on a top surface of the device structure to be connected to the top electrode, and the second process may include heating or melting the second material by radiating the laser onto the laser receiving pad to increase a dielectric constant of the dielectric film. In this case, the device structure may include a capacitor structure of a DRAM, and the first material may include titanium nitride (TiN) or ruthenium (Ru) and the second material may include any one of $HfO_2$, $HfSiO_2$, $ZrO_2$, $ZrSiO_4$, $La_2O_3$, $LaAlO_3$, $Al_2O_3$, $Ta_2O_5$, $Y_2O_3$, $TiO_2$, and $SrTiO_3$. Further, the second process may include sequential phase transformations of the dielectric film into an amorphous structure, a monoclinic structure, a tetragonal structure, and a cubic structure.

In the indirect heating method using a laser, the first process may include: forming a gate oxide film to form a transistor structure of a memory device; forming, as the second material structure, a polysilicon film on the gate oxide film; and sequentially forming, as the first material structure, a titanium nitride (TiN) film, a tungsten nitride (WN) film, a tungsten silicide (W Si) film, or a tantalum nitride (TaN) film and a tungsten (W) film on the polysilicon film, and the second process may include heating or melting at least a part of the polysilicon film by radiating the laser onto the tungsten film to reduce an equivalent oxide thickness (EOT) of the transistor.

In the indirect heating method using a laser, the first process may include: forming, as the second material structure, a dielectric film to form a transistor structure of a logic device; and sequentially forming, as the first material structure, a titanium nitride (TiN) film and a tungsten (W) film on the polysilicon film, and the second process may include heating or melting at least a part of the polysilicon film by radiating the laser onto the tungsten film to reduce an equivalent oxide thickness (EOT) of the transistor.

In the indirect heating method using a laser, the first process may include: forming, as the second material structure, an amorphous polysilicon film; and forming the first material structure on the amorphous polysilicon film, and the second process may include heating or melting at least a part of the amorphous polysilicon film by radiating the laser onto the first material structure to reduce a resistance of the second material structure.

In the indirect heating method using a laser, the first process may include forming, as the second material structure, a photosensitive film on the first material structure, and the second process may include baking the photosensitive film by radiating the laser onto the first material structure.

According to an embodiment of the present disclosure, it is possible to implement a method of indirect heating of inorganic material-containing material using a YAG laser, a diode laser, or a $CO_2$ laser. The scope of the present disclosure is not limited by this effect.

DETAILED DESCRIPTION OF THE INVENTION

Figure 1:
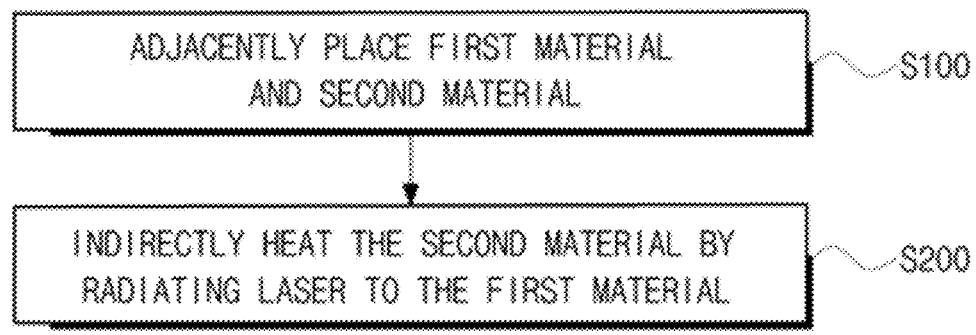
FIG. 1 is a flowchart illustrating an indirect heating method using a laser according to an embodiment of the present disclosure.

Hereafter, embodiments of the present disclosure will be described in more detail with reference to the accompanying drawings. However, the present disclosure is not limited to the following embodiments, but may be implemented in various different forms. The embodiments are provided only to complete disclosure of the present disclosure and to fully provide a person with ordinary skill in the art with the category of the invention. Further, for convenience of explanation, the sizes of components may be exaggerated or reduced relative to one another in the drawings.

FIG. 1 is a flowchart illustrating an indirect heating method using a laser according to an embodiment of the present disclosure.

Referring to FIG. 1, an indirect heating method using a laser according to an embodiment of the present disclosure includes: a first process of adjacently placing a first material structure containing metal and a second material structure containing inorganic material (S100); and a second process of directly heating the first material structure to indirectly heat the second material structure adjacent to the first material structure by radiating a long-wavelength laser to the first material structure (S200). The materials may be so composed that heat generated by radiating the laser to the first material structure is more than heat generated by radiating the laser to the second material structure.

According to some embodiments of the present disclosure, the long-wavelength laser may be a $CO_2$ laser. That is, it is implemented using $CO_2$ as a source and may have a mean wavelength of 10 μm to 11 μm (e.g., 10.6 μm). The $CO_2$ laser can oscillate infrared light of 10.6 μm between vibrational levels of $CO_2$ gas molecules and has high efficiency and thus can easily output high power. For example, when a DC voltage of about 10 kV is applied to a pyrex tube having a length of about 1 m while $CO_2$, He, and $N_2$ are allowed to flow therein at a predetermined ratio, a glow discharge occurs. A population inversion will be described. A $N_2$ molecule is excited to a vibrational level of V"=1 from V"=0 due to a collision between an electron and $N_2$ during a discharge. This excited level is not much different in energy from (001) vibrational level of a $CO_2$ molecule, and a collision between the two molecules causes the $N_2$ molecule to transfer energy to the $CO_2$ molecule and then fall down. Due to this process, the $CO_2$ molecule is excited to (001) level. Between (001) vibrational level of the excited $CO_2$ and (100) vibrational level lower in energy than (001) vibrational level, a population inversion is formed. Thus, laser oscillation can occur. Therefore, although laser oscillation occurs in a $CO_2$ molecule, efficient excitation to (001) level can occur by adding $N_2$. Meanwhile, lower (001) level can be easily eliminated by mixing a He gas, and, thus, the population inversion can easily occur. Therefore, the efficiency can be increased.

The $CO_2$ laser having a wavelength of 10.6 μm is implemented by this mechanism and can efficiently heat a material containing metal having relatively many free electrons to a very high temperature (e.g., 2000° C. to 3000° C.). However, it is relatively difficult for the $CO_2$ laser to heat a material containing inorganic material (e.g., $SiO_2$, Si, $Si_3N_4$).

In the present disclosure using these characteristics, a first material structure containing metal and a second material structure containing inorganic material are placed adjacent to each other (e.g., placed in contact with each other) and then, the laser having a mean wavelength of 10 μm to 11 μm and using $CO_2$ as a source is radiated to the first material structure to directly heat the first material structure and thus indirectly heat the second material structure adjacent to the first material structure.

Accordingly, the second material structure containing inorganic material can be heated by selectively radiating the laser only to the patterned first material structure, and, thus, only the second material structure can be locally heated rather than heating the entire device. This advantage makes it possible to control the characteristics of the second material structure, suppress thermal degradation of the device, and reduce time and cost for manufacturing.

Meanwhile, although the $CO_2$ laser is described as a laser radiated to the first material structure in FIG. 1, a YAG laser or a diode laser may also be radiated to the first material structure. The YAG laser is a solid state laser implemented by adding various rare elements such as neodymium (Nd), erbium (Er), ytterbium (Yb), or the like into a yttrium aluminum garnet (YAG) crystal.

The YAG laser is implemented by this mechanism and can efficiently heat a material containing metal having relatively many free electrons to a very high temperature. However, it is relatively difficult for the YAG laser to heat a material containing inorganic material (e.g., $SiO_2$, Si, $Si_3N_4$).

In the present disclosure using these characteristics, a first material structure containing metal and a second material structure containing inorganic material are placed adjacent to each other (e.g., placed in contact with each other) and then, the YAG laser is radiated to the first material structure to directly heat the first material structure and thus indirectly heat the second material structure adjacent to the first material structure.

Hereafter, specific embodiments of the above-described indirect heating method using a laser will be described to facilitate understanding of the technical concept of the present disclosure.

First Embodiment

Figure 2:
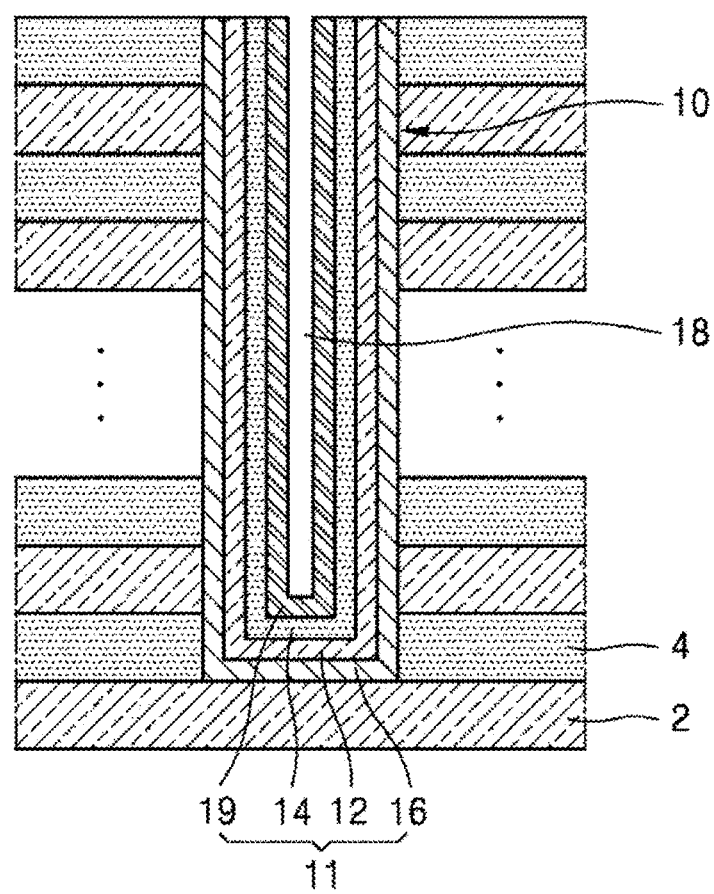
FIG. 2, FIG. 3 and FIG. 4 illustrate a method of heating a channel film in a vertical NAND (VNAND) structure as an indirect heating method using a laser according to an embodiment of the present disclosure.
Figure 3:
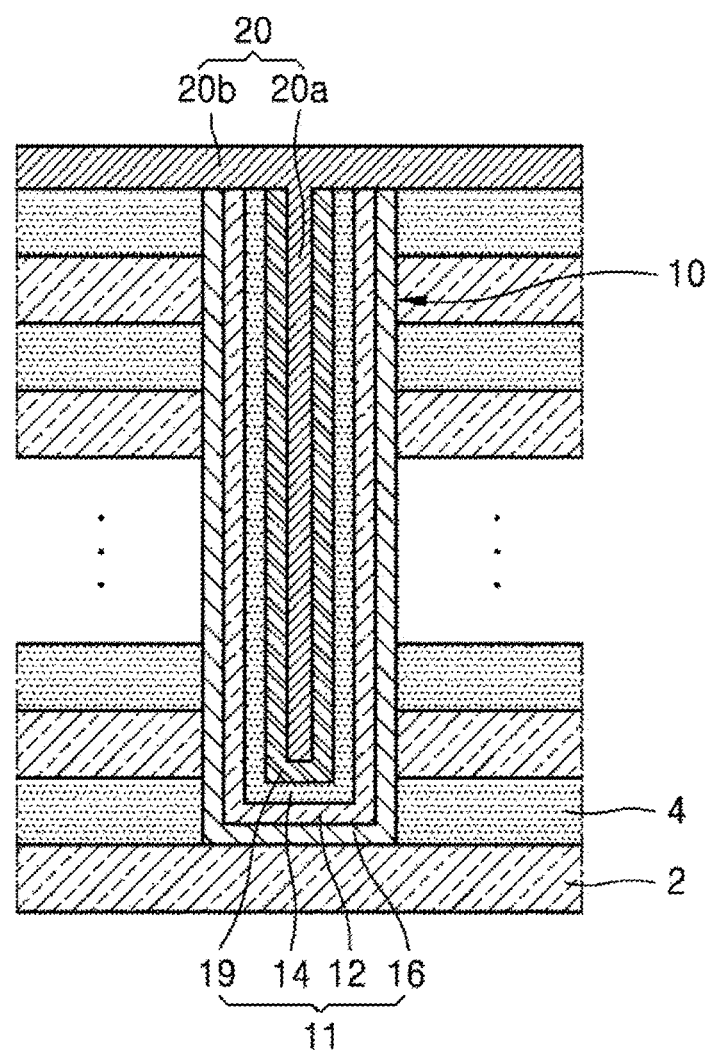
Figure 4:
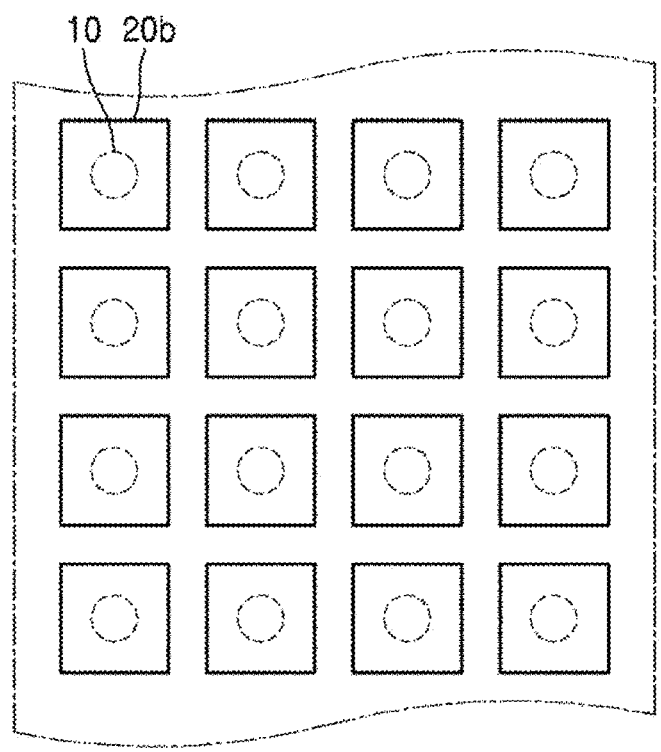

FIG. 2 to FIG. 3 are cross-sectional views sequentially illustrating a method of heating a channel film in a vertical NAND (VNAND) structure as an indirect heating method using a laser according to an embodiment of the present disclosure. FIG. 4 is a plan view of the structure illustrated in FIG. 3 when viewed from another side.

Referring to FIG. 1 to FIG. 4, the first process (S100) may include: forming insulating films 12, 14, and 16 within a trench 10 implemented in a device structure and forming, as the second material structure, a channel film 19 of a second material on the insulating films 12, 14, and 16 within the trench 10; and after forming the channel film 19, forming, as the first material structure 20, a core portion 20a of a first material filing an empty space 18 within the trench 10 and a laser receiving pad 20b of the first material on a top surface of the device structure to be connected to the core portion 20a. Further, the second process (S200) may include heating or melting the second material by radiating the laser onto the laser receiving pad 20b to reduce a resistance of the channel film 19.

The device structure may include a vertical NAND (VNAND) structure, and the second material may include polysilicon. The insulating films 12, 14, and 16 may include a trap layer formed of silicon nitride, a blocking-oxide layer 16 formed of aluminum oxide, and a HQ oxide layer 14 formed of silicon oxide.

With a conventional laser, there was a limit to heating or melting the entire polysilicon (having a depth of 4 µm to 5 µm) which forms a channel layer of a vertical NAND (VNAND) structure. However, if the first material is used for gap-fill or macaroni-fill and then annealing is performed using the $CO_2$ laser, the first material can be heated and a channel layer formed of polysilicon as the second material in contact with the first material can be heated or melted. Thus, a resistance can be reduced and a current of the channel can be increased. Then, the first material provided thereafter for gap-fill or macaroni-fill is removed by an appropriate method. As the number of stacks of the vertical NAND (VNAND) structure increases, it becomes more important to increase a current by reducing a resistance of the channel film 19. In the present embodiment, this can be implemented by forming the above-described first material structure around the channel film 19 and then performing $CO_2$ laser annealing.

Meanwhile, it is not easy to directly emit the $CO_2$ laser to the core portion 20a having a small cross-section area to indirectly heat the channel film 19. Therefore, it is effective to form the laser receiving pad 20b having a relatively large cross-section area and connected to the core portion 20a and then emit the $CO_2$ laser to the laser receiving pad 20b.

Second Embodiment

Referring to FIG. 1, the first process (S100) may include: forming a bottom electrode within a trench implemented in a device structure; forming, as the second material structure, a dielectric film of a second material on the bottom electrode within the trench; and forming, as the first material structure, a top electrode of a first material on the dielectric film within the trench and a laser receiving pad of the first material on a top surface of the device structure to be connected to the top electrode, and the second process (S200) may include heating or melting the second material by radiating the laser onto the laser receiving pad to increase a dielectric constant of the dielectric film.

Figure 5:
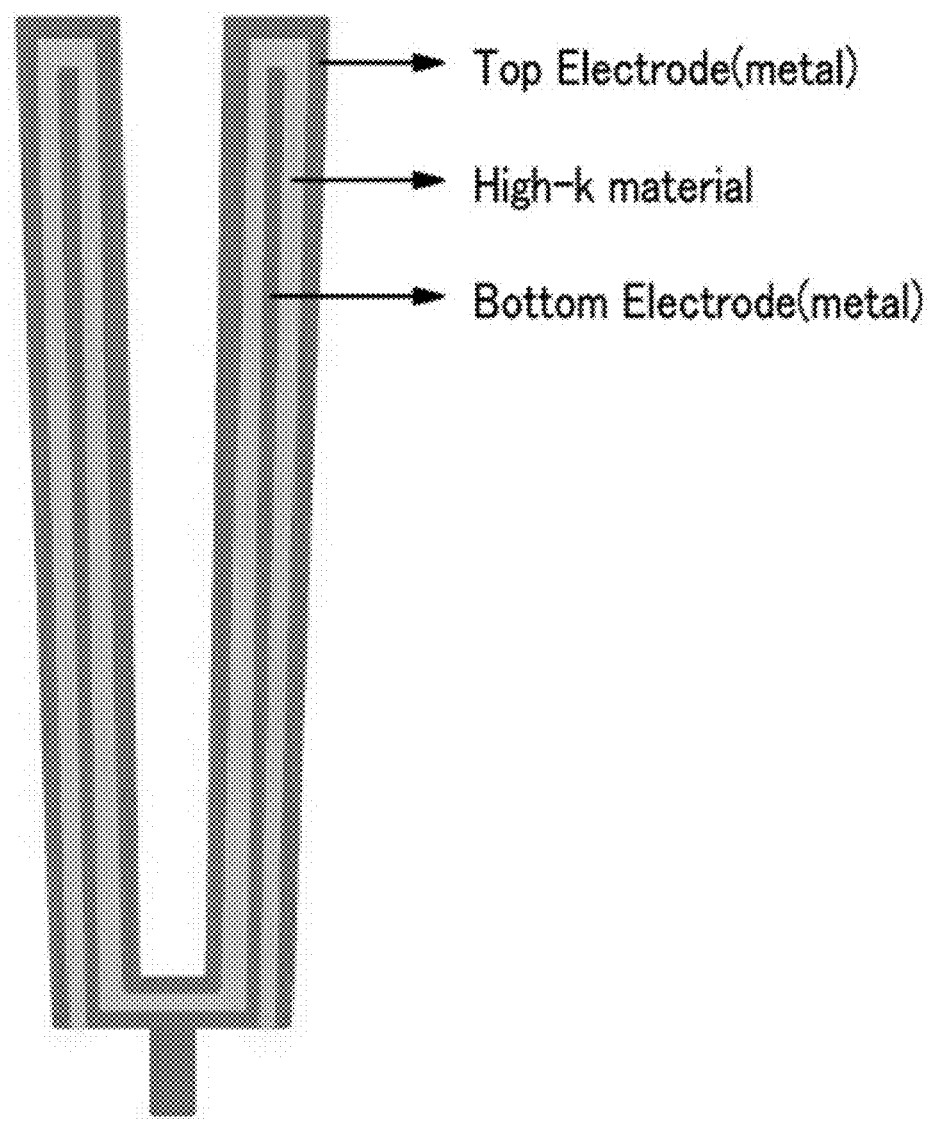
FIG. 5 illustrates a DRAM capacitor structure implemented by employing an indirect heating method using a laser according to an embodiment of the present disclosure.

FIG. 5 illustrates a DRAM capacitor structure implemented by employing an indirect heating method using a laser according to an embodiment of the present disclosure.

The device structure may include a capacitor structure of a DRAM illustrated in FIG. 5, and the first material may include titanium nitride (TiN) or ruthenium (Ru) and the second material may include any one of $HfO_2$, $HfSiO_4$, $ZrO_2$, $ZrSiO_4$, $La_2O_3$, $LaAlO_3$, $Al_2O_3$, $Ta_2O_5$, $Y_2O_3$, $TiO_2$, and $SrTiO_3$. In this case, the second process (S200) may include sequential phase transformations of the dielectric film into an amorphous structure, a monoclinic structure, a tetragonal structure, and a cubic structure. Thus, it is possible to implement a dielectric film having sufficiently high permittivity.

That is, the use of the $CO_2$ laser makes it possible to obtain a tetragonal structure or cubic structure with assured high permittivity from any one of $HfO_2$, $HfSiO_4$, $ZrO_2$, $ZrSiO_4$, $La_2O_3$, $LaAlO_3$, $Al_2O_3$, $Ta_2O_5$, $Y_2O_3$, $TiO_2$, and $SrTiO_3$ whose phase is transformed at a relatively high temperature and thus to implement higher dielectric characteristics.

Third Embodiment

Referring to FIG. 1, the first process (S100) may include: forming a gate oxide film to form a transistor structure of a memory device; forming, as the second material structure, a polysilicon film on the gate oxide film; and sequentially forming, as the first material structure, a titanium nitride (TiN) film, a tungsten nitride (WN) film, a tungsten silicide (WSi) film, or a tantalum nitride (TaN) film and a tungsten (W) film on the polysilicon film, and the second process (S200) may include heating or melting at least a part of the polysilicon film by radiating the laser onto the tungsten film to reduce an equivalent oxide thickness (EOT) of the transistor.

That is, the transistor structure of a DRAM (or FLASH) is formed of gate oxide/polysilicon/metal (TiN/W). Since it is easy to heat the metal, activation of B or P can be enhanced by inducing local heating or melting of the polysilicon in contact with the metal, and, thus, it is possible to reduce polysilicon depletion and thus reduce the EOT. That is, activation can be performed sufficiently to remove polysilicon depletion in the metal gate for a short time at a high temperature by metal assisted heating.

Fourth Embodiment

Referring to FIG. 1, the first process (S100) may include: forming, as the second material structure, a dielectric film to form a transistor structure of a logic device; and sequentially forming, as the first material structure, a titanium nitride (TiN) film, a tantalum nitride (TaN) film, a tungsten nitride (WN) film, or a tungsten silicide (WSi) film and a tungsten (W) film on the polysilicon film, and the second process (S200) may include heating or melting at least a part of the polysilicon film by radiating the laser onto the tungsten film to reduce an equivalent oxide thickness (EOT) of the transistor. In the present embodiment, the polysilicon film may be substituted with a high-k film.

That is, the transistor structure of a logic device is formed of High-k/TiN (or TaN)/W, and, thus, it is possible to indirectly heat the high-k material by heating the metal and then obtain higher-k and reduce the EOT by phase transformation.

Fifth Embodiment

Referring to FIG. 1, the first process (S100) may include: forming, as the second material structure, an amorphous polysilicon film; and forming the first material structure on the amorphous polysilicon film, and the second process (S200) may include heating or melting at least a part of the amorphous polysilicon film by radiating the laser onto the first material structure to reduce a resistance of the second material structure.

One of the methods for reducing a resistance of polysilicon (or amorphous silicon) is a poly-melt method which is an easy method to increase general grain sizes. By connecting polysilicon (or amorphous silicon) to metal and using a $CO_2$ laser, melting of the polysilicon (or amorphous silicon) can be implemented by heating of the metal.

Sixth Embodiment

Referring to FIG. 1, the first process (S100) may include forming, as the second material structure, a photosensitive film on the first material structure, and the second process (S200) may include baking the photosensitive film by radiating the laser onto the first material structure.

For example, an EUV photosensitive film can be baked by depositing metal under the EUV photosensitive film. Since EUV has a wavelength of 13.5 nm, the EUV photosensitive film can be affected even in the visible light region. Therefore, a $CO_2$ laser having the longest wavelength can be most efficient.

Figure 6:
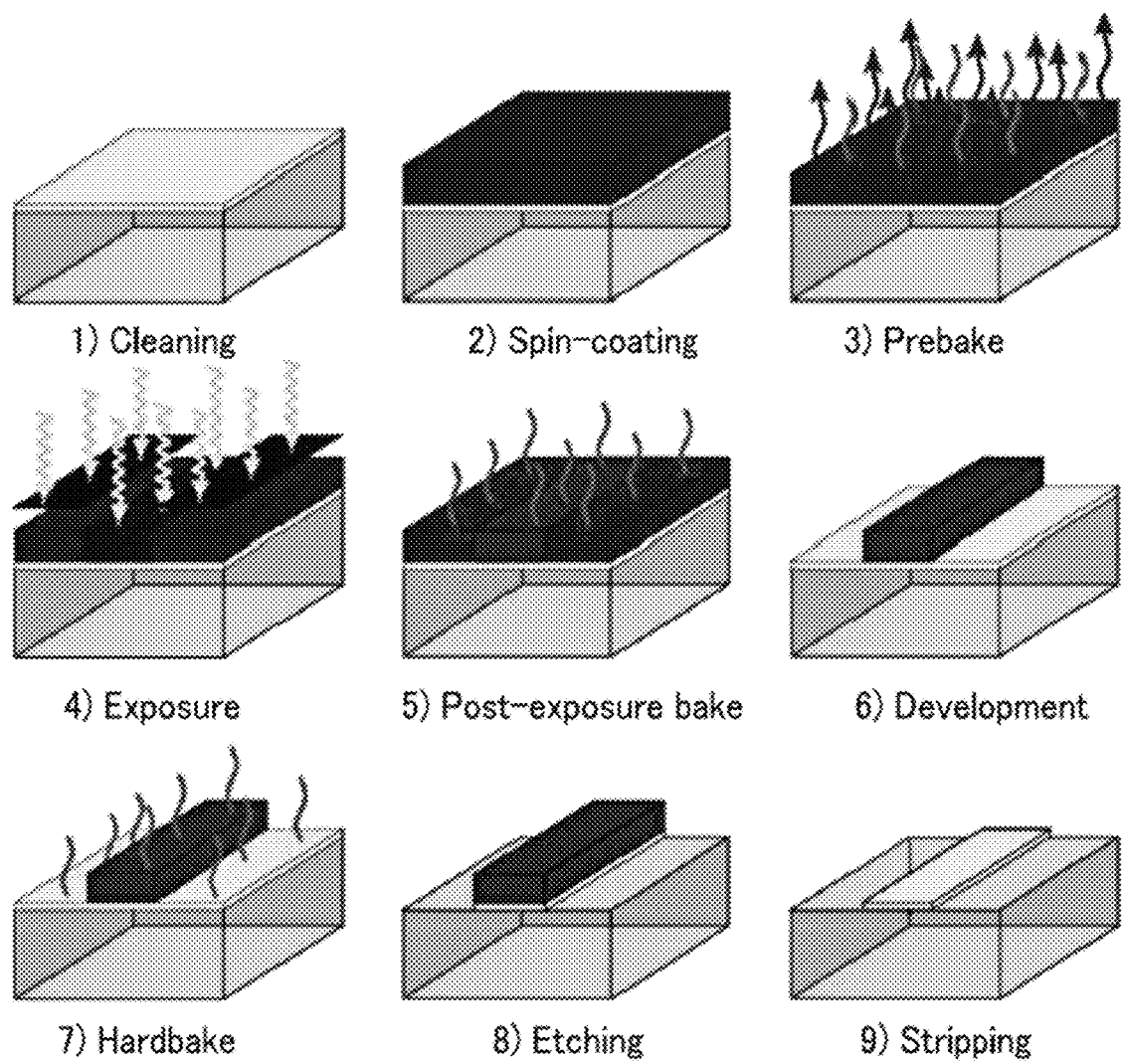
FIG. 6 sequentially illustrates an EUV lithography process.

FIG. 6 sequentially illustrates an EUV lithography process. In FIG. 6, a pre-bake process (process 3) and a post-exposure bake process (process 5) are relevant to a diffusion process of acid and base and include the above-described second process (S200) of baking the photosensitive film by radiating the laser onto the first material structure.

Various other embodiments are also possible.

Figure 7:
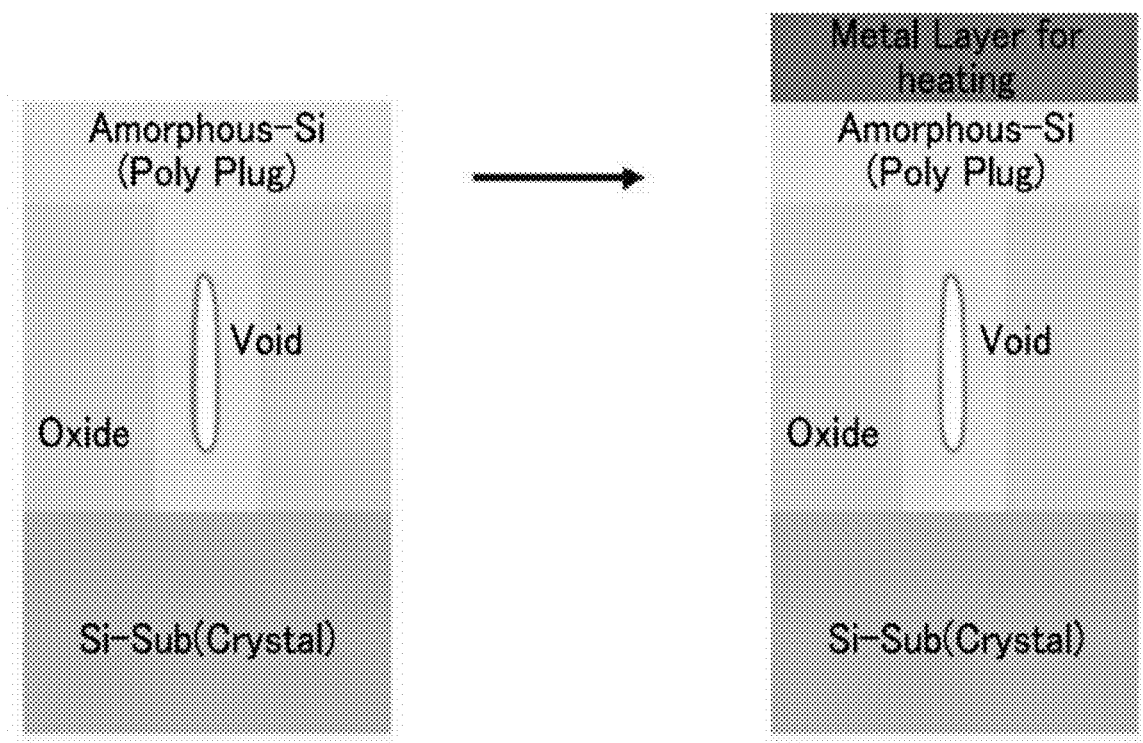
FIG. 7 illustrates a contact structure of a DRAM implemented by employing an indirect heating method using a laser according to an embodiment of the present disclosure.

FIG. 7 illustrates a contact structure of a DRAM implemented by employing an indirect heating method using a laser according to an embodiment of the present disclosure. Referring to FIG. 7, a resistance of a polysilicon contact plug increases in the presence of a void. However, if a metal layer is added and polysilicon is indirectly heated by the above-described indirect heating method using a laser according to an embodiment of the present disclosure, the void can be removed by re recrystallization and a contact resistance can be reduced.

Figure 8:
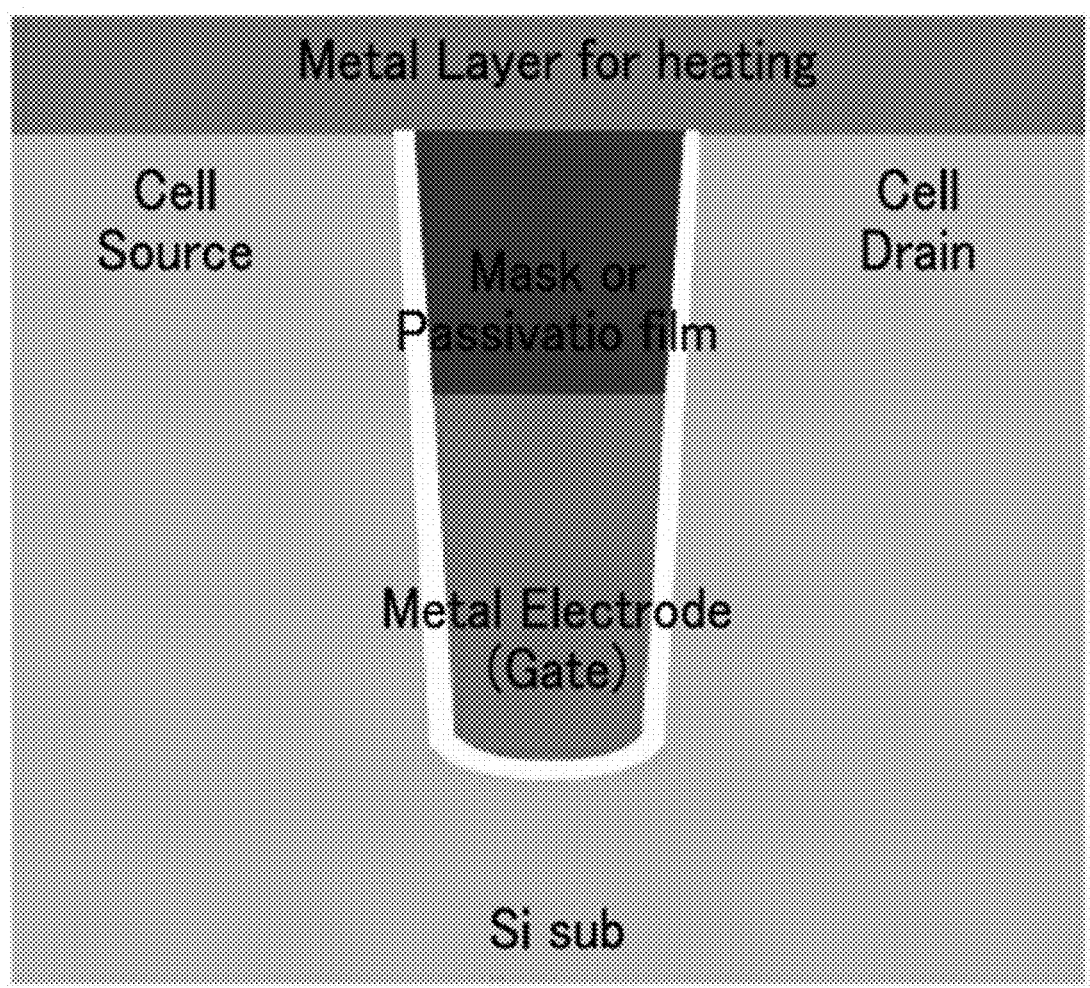
FIG. 8 illustrates a S/D structure of a cell implemented by employing an indirect heating method using a laser according to an embodiment of the present disclosure.

FIG. 8 illustrates a S/D structure of a memory cell implemented by employing an indirect heating method using a laser according to an embodiment of the present disclosure. Referring to FIG. 8, it is important for a new memory structure having an embedded cell array transistor to reduce Rs/Rc values in ON state. This issue can be solved by the above-described indirect heating method using a laser.

The present disclosure has been described with reference to the embodiments illustrated in the drawings, but these embodiments are merely illustrative and it should be understood by a person with ordinary skill in the art that various modifications and equivalent embodiments can be made without departing from the scope of the present disclosure. Therefore, the true technical protective scope of the present disclosure must be determined based on the technical concept of the appended claims.

What is claimed is:

1. An indirect heating method using a laser, comprising:
a first process of adjacently placing a first material structure containing metal and a second material structure containing inorganic material; and
a second process of directly heating the first material structure to indirectly heat the second material structure adjacent to the first material structure by radiating the laser to the first material structure,
wherein the first process includes:
forming an insulating film within a trench implemented in a device structure and forming, as the second material structure, a channel film of a second material on the insulating film within the trench; and
after forming the channel film, forming, as the first material structure, a core portion of a first material filing an empty space within the trench and a laser receiving pad of the first material on a top surface of the device structure to be connected to the core portion, and
wherein the second process includes heating or melting the second material by radiating the laser onto the laser receiving pad to reduce a resistance of the channel film.

2. The indirect heating method using the laser of claim 1, wherein the first material structure and the second material structure are placed in contact with each other.

3. The indirect heating method using the laser of claim 1, wherein heat generated by radiating the laser to the first material structure is more than heat generated by radiating the laser to the second material structure.

4. The indirect heating method using theft laser of claim 1, wherein the device structure includes a vertical NAND (VNAND) structure, and the second material includes polysilicon.

5. An indirect heating method using a laser, comprising:
a first process of adjacently placing a first material structure containing metal and a second material structure containing inorganic material; and
a second process of directly heating the first material structure to indirectly heat the second material structure adjacent to the first material structure by radiating the laser to the first material structure,
wherein the first process includes:
forming a bottom electrode within a trench implemented in a device structure;
forming, as the second material structure, a dielectric film of a second material on the bottom electrode within the trench; and
forming, as the first material structure, a top electrode of a first material on the dielectric film within the trench and a laser receiving pad of the first material on a top surface of the device structure to be connected to the top electrode, and
wherein the second process includes heating or melting the second material by radiating the laser onto the laser receiving pad to increase a dielectric constant of the dielectric film.

6. The indirect heating method using the laser of claim 5, wherein the device structure includes a capacitor structure of a DRAM, and the first material includes titanium nitride (TiN) and the second material include any one of $HfO_2$, $HfSiO_4$, $ZrO_2$, $ZrSiO_4$, $La_2O_3$, $LaAlO_3$, $Al_2O_3$, $Ta_2O_5$, $Y_2O_3$, $TiO_2$, and $SrTiO_3$.

7. The indirect heating method using the laser of claim 6, wherein the second process includes sequential phase transformations of the dielectric film into an amorphous structure, a monoclinic structure, a tetragonal structure, and a cubic structure.

8. An indirect heating method using a laser, comprising:
a first process of adjacently placing a first material structure containing metal and a second material structure containing inorganic material; and
a second process of directly heating the first material structure to indirectly heat the second material structure adjacent to the first material structure by radiating the laser to the first material structure,
wherein the first process includes:
forming a gate oxide film to form a transistor structure of a memory device;
forming, as the second material structure, a polysilicon film on the gate oxide film; and
sequentially forming, as the first material structure, a titanium nitride (TiN) film, a tungsten nitride (WN) film, a tungsten silicide (WSi) film, or a tantalum nitride (TaN) film and a tungsten (W) film on the polysilicon film, and
wherein the second process includes heating or melting at least a part of the polysilicon film by radiating the laser onto the tungsten film to reduce an equivalent oxide thickness (EOT) of the transistor.

9. An indirect heating method using a laser, comprising:
a first process of adjacently placing a first material structure containing metal and a second material structure containing inorganic material; and
a second process of directly heating the first material structure to indirectly heat the second material structure adjacent to the first material structure by radiating the laser to the first material structure,
wherein the first process includes:
forming, as the second material structure, a dielectric film to form a transistor structure of a logic device; and
sequentially forming, as the first material structure, a titanium nitride (TiN) film and a tungsten (W) film on a polysilicon film, and
wherein the second process includes heating or melting at least a part of the polysilicon film by radiating the laser onto the tungsten film to reduce an equivalent oxide thickness (EOT) of the transistor.

10. An indirect heating method using a laser, comprising:
a first process of adjacently placing a first material structure containing metal and a second material structure containing inorganic material; and
a second process of directly heating the first material structure to indirectly heat the second material structure adjacent to the first material structure by radiating the laser to the first material structure,
wherein the first process includes forming, as the second material structure, a photosensitive film on the first material structure, and
wherein the second process includes baking the photosensitive film by radiating the laser onto the first material structure.

\* \* \* \* \*